United States Patent [19]

Freedman et al.

[11] Patent Number: 4,968,380
[45] Date of Patent: Nov. 6, 1990

[54] SYSTEM FOR CONTINUOUSLY REPLENISHING MELT

[75] Inventors: Gary M. Freedman, Stow; Lawrence L. Perletz, Reading; John G. Willis, Chelmsford, all of Mass.

[73] Assignee: Mobil Solar Energy Corporation, Billerica, Mass.

[21] Appl. No.: 356,558

[22] Filed: May 24, 1989

[51] Int. Cl.$^5$ ............... C30B 15/34; C30B 35/00; C30B 29/60
[52] U.S. Cl. ................. 156/608; 156/617.1; 156/620.1; 156/620.71; 156/DIG. 88; 156/DIG. 115; 422/247; 422/249; 422/246
[58] Field of Search ............ 156/608, 617.1, 620.1, 156/620.71, DIG. 88, 620.4, DIG. 84, Dig 115; 422/245, 246, 247, 248, 249

[56] References Cited

U.S. PATENT DOCUMENTS

| | | | |
|---|---|---|---|
| 3,033,660 | 5/1962 | Okkerse ................. | 156/620.3 |
| 3,687,633 | 8/1972 | La Belle, Jr. et al. ......... | 156/608 |
| 3,951,348 | 7/1972 | La Belle, Jr. et al. ......... | 422/249 |
| 3,954,551 | 5/1976 | Cecil et al. ................. | 156/620.1 |
| 4,230,674 | 10/1980 | Taylor et al. ............... | 156/DIG. 88 |
| 4,440,728 | 4/1984 | Stormont et al. ............ | 422/246 |
| 4,661,324 | 4/1987 | Sink et al. ................. | 422/249 |
| 4,711,695 | 12/1987 | Stormont et al. ............ | 156/608 |

FOREIGN PATENT DOCUMENTS

| | | | |
|---|---|---|---|
| 1240825 | 5/1967 | Fed. Rep. of Germany ... | 156/617.1 |
| 1219626 | 5/1960 | France ..................... | 156/617.1 |
| 903411 | 8/1962 | United Kingdom ............ | 422/249 |
| 2155806 | 10/1985 | United Kingdom ............ | 422/249 |

Primary Examiner—Gary P. Straub
Attorney, Agent, or Firm—Schiller, Pandiscio & Kusmer

[57] ABSTRACT

A system for continuously supplying solid silicon particles to an apparatus for growing hollow, tubular crystalline bodies. The system includes a container for storing solid silicon particles, a vibratory, pneumatic, or other device for causing the particles to exit the container through an aperture in the bottom thereof, a receiving chamber coupled with the container for receiving the particles which are dispensed from the container, and means for providing a jet of pressurized fluid in the receiving chamber. The latter is coupled with the crucible of the crystal growth apparatus via a conduit extending up through the center of the crucible.

In operation, silicon particles are dispensed from the container, travel into the receiving chamber where they are entrained by the jet of pressurized fluid which drives the particles out of the receiving chamber, through the conduit, and into the crystal growth furnace where they fall back into the molten silicon supported in the crucible.

20 Claims, 2 Drawing Sheets

SYSTEM FOR CONTINUOUSLY REPLENISHING MELT

FIELD OF THE INVENTION

The present invention relates to apparatus for growing hollow tubular crystalline bodies, and more particularly to apparatus for delivering solid silicon particles to the crucible of such crystal growing apparatus before and/or during the growth process.

BACKGROUND OF THE INVENTION

As is known, apparatus for growing hollow, tubular crystalline bodies of the type disclosed in U.S. Pat. No. 4,544,528 comprise a crucible for supporting molten silicon which constitutes the feed material from which the crystalline body is grown. In the past, the silicon melt was replenished in batches rather than continuously so as to avoid thermally shocking the system, thereby catastrophically terminating the crystal-growing process. Such batch replenishment was found to be a relatively slow and inefficient method of adding silicon particles to the melt.

To overcome the problems associated with batch replenishment, a system was developed for continuously replenishing the melt. This system is described in U.S. Pat. No. 4,661,324, issued Apr. 28, 1987 in the name of Sink et al. (the 324' patent). The system of the 324' patent includes (1) a conduit leading up through the crucible and terminating in the interior of the inner after-heater of the furnace above the tip of the die and (2) a chip thruster coupled to the conduit and to a source of solid irregularly-shaped silicon particles. Silicon particles are fed into the chip thruster which periodically forces a predetermined volume of the particles up through the conduit and into the interior of the inner after-heater. Thereafter, the chips fall, under the pull of gravity, into the melt.

Unfortunately, the system of the 324' patent suffers from several problems. First, because the chip thruster portion of the system includes a significant number of mechanical parts, and because the chip thruster is constantly handling abrasive material (i.e. irregularly-shaped particles of solid silicon), the chip thruster tends to break down. Second, the abrasive silicon particles tend to erode or abrade away minute portions of the metallic components of the chip thruster, which portions are delivered along with the silicon particles into the melt. These minute portions of metal tend to contaminate the melt. Third, because the mass of a predetermined volume of irregularly-shaped silicon particles varies from one volume of particles to the next depending upon how the chips orient themselves relative to one another, and because the chip thruster ejects a predetermined volume, not mass, of particles into the furnace, it is virtually impossible to repeatedly add a predetermined mass of chips to the furnace. To minimize thermal excursions to the level necessary to maintain a substantially continuous crystal growth process, it is important where irregularly-shaped silicon particles are used as the feed material that a predetermined mass of particles always be added to the melt. For the reasons noted above, the chip thruster system is not capable of repeatedly providing such a predetermined mass of irregularly-shaped particles to the melt.

OBJECTS AND SUMMARY OF THE INVENTION

One object of the present invention is to provide a system for continuously replenishing the silicon melt in an apparatus for growing hollow, tubular crystalline bodies which is highly reliable and does not inadvertently add contaminants to the melt.

A second object of the present invention is to provide a system for continuously replenishing the silicon melt in an apparatus for growing hollow, tubular crystalline bodies in a way which does not create unacceptably large thermal excursions or perturbations of the melt.

These and other objects are achieved by a system for continuously replenishing the silicon melt in a crucible in a crystal furnace, e.g., of the type disclosed in U.S. Pat. No. 4,544,528 to Stormont et al., which has been modified to include a conduit extending up through the crucible and terminating in the interior of the inner after-heater above the tip of the die. The system includes a container for storing spherical, solid silicon particles of predetermined diameter, a receiving chamber coupled with the conduit and with the container, and a high pressure gas jet coupled with the receiving chamber. A particle dispenser comprising a vibrator, a second high pressure gas jet, or some other means is provided for causing the silicon particles to move from the container to the receiving chamber. Silicon particles in the receiving chamber are forced up through the conduit into the interior of the inner-after heater of the crystal growth furnace directly above the crucible by the high pressure gas jet. Thereafter, the silicon particles fall, under the pull of gravity, down into the melt contained in the crucible. A deflector is preferably provided in the crystal growth furnace directly above the upper end of the conduit for deflecting silicon particles emitted from the conduit so that they fall into the melt in a substantially evenly-distributed pattern over the surface of the melt, thereby minimizing the formation of currents or thermal excursions in the melt.

BRIEF DESCRIPTION OF THE DRAWINGS

For a fuller understanding of the nature and objects of the present invention, reference should be made to the following detailed description taken in connection with the accompanying drawings wherein.

DETAILED DESCRIPTION OF THE INVENTION

Figure 1:
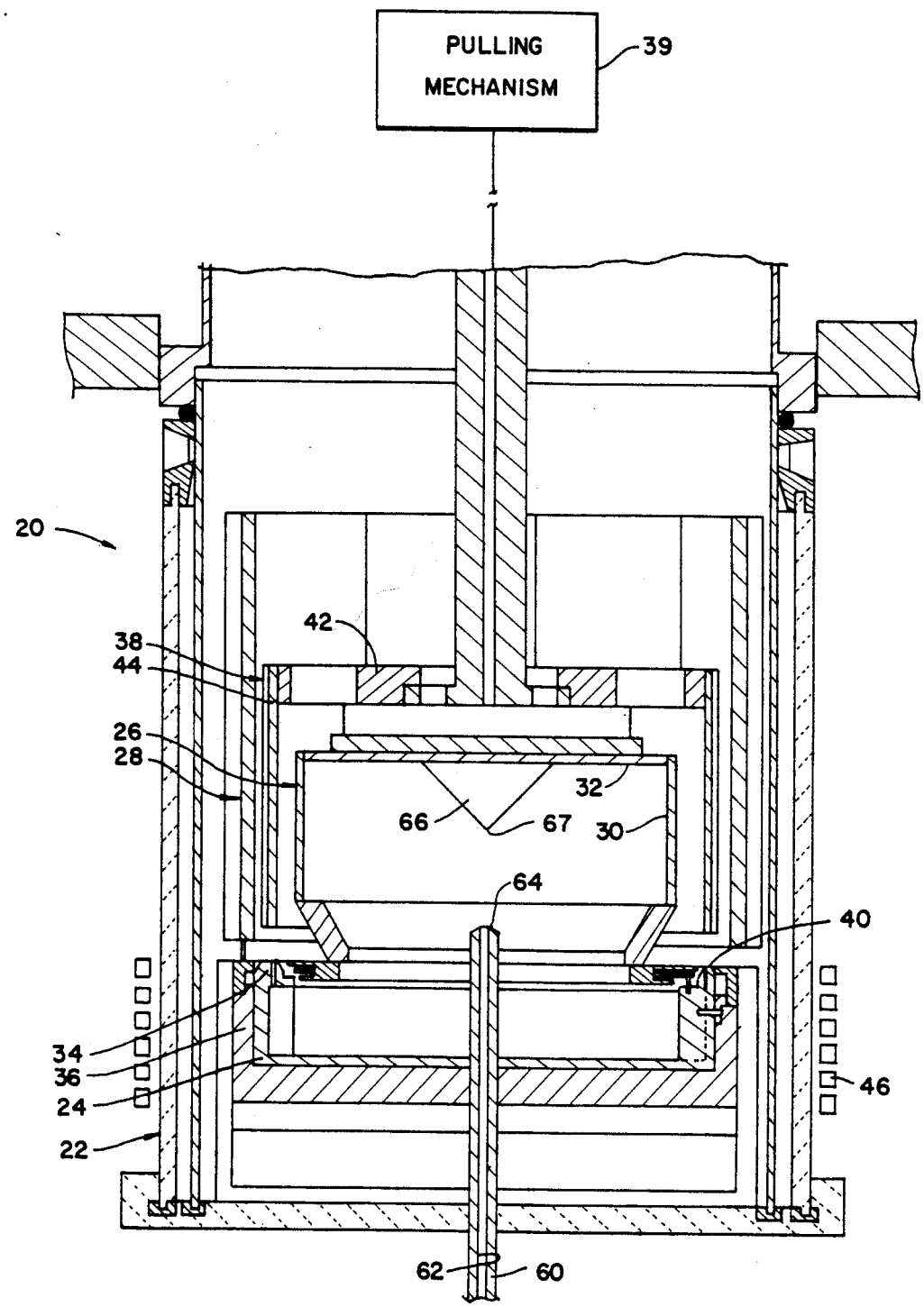
FIG. 1 is a cross-sectional side elevation view of a crystal growth furnace which is designed to be used with the silicon feed system of the present invention.
Figure 2:
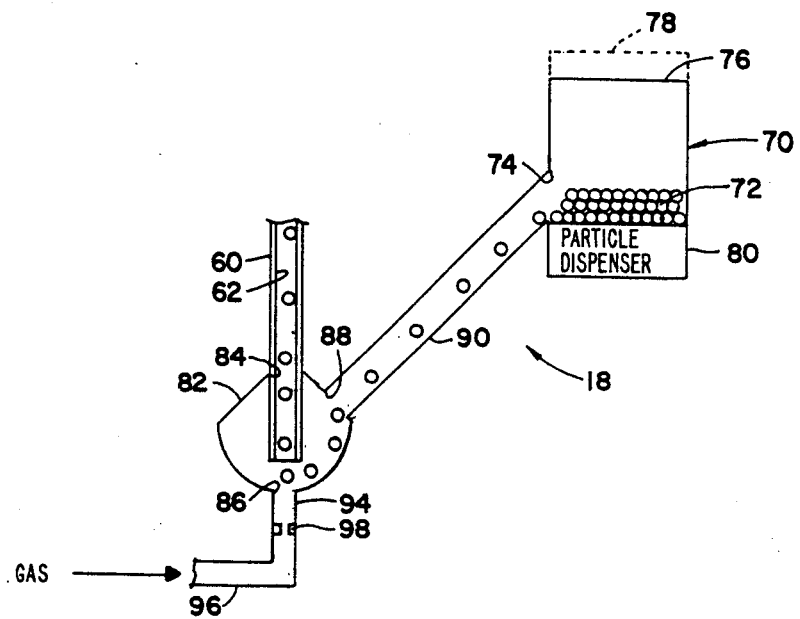
FIG. 2 is a schematic cross-sectional side elevation of the silicon feed system of the present invention.

Referring to FIGS. 1 and 2, the present invention is a system 18 for continuously supplying spherical, solid silicon particles to the crucible of an apparatus 20 for growing hollow, tubular crystalline bodies of the type disclosed in U.S. Pat. No. 4,544,528 (the '528 patent), which patent is incorporated herein by reference.

Apparatus 20 comprises a furnace enclosure 22 within which are disposed crucible 24, and inner and outer after-heaters 26 and 28. Crucible 24 is a short, hollow, open-topped right prism or right circular cylinder centrally disposed within enclosure 22. Inner after-heater 26 has a hollow interior 30 and a top plate 32 sealing off top end of the inner after-heater. The bottom of the inner after-heater 26 is open, and the inner after-heater is positioned directly above crucible 24 whereby interior 30 of the inner after-heater is coupled with the interior of the crucible. Inner after-heater 26 is located in the hollow interior of outer after-heater 28.

Apparatus 20 additionally comprises a capillary die 34, a susceptor 36 and a seed assembly 38, all of which are positioned in enclosure 22. Preferably, capillary die 34 is an integral part of the sidewall of crucible 24. The shape and dimension of the end face 40 of die 34 are selected to control the form and size of the grown crystal. Susceptor 36 is a short, hollow open-topped cylindrical or prismatic body dimensioned to accommodate crucible 24. Susceptor 36 may be an integral part of the die/crucible assembly. Seed assembly 38 includes a seed holder 42 and a seed 44. Seed assembly 38 is attached to a pulling mechanism 39 which is adapted to move seed holder 47 axially toward and away from die 34.

Apparatus 20 further includes a radio-frequency heating coil 46 surrounding enclosure 22 adjacent crucible 24. Heating coil 46 maintains the silicon in crucible 24 in a molten state.

As is known, the crystalline body is grown by positioning seed 44 in contact with the die end face 40 and then pulling the seed away from the die end face so as to form a meniscus between the seed and the die end face. As the seed is pulled away from the die end face, the portion of the meniscus closest to the seed solidifies. As the seed crystal is pulled even farther away from the die, new molten silicon is drawn by capillary action onto the die end face and molten silicon already present in the meniscus hardens to the solidified silicon attached to the seed, so as to form an elongate crystalline body.

For a more detailed description of the construction and operation of apparatus 20, attention is directed to the '528 patent.

For the purpose of the present invention, apparatus 20 is modified to include a conduit 60 having a central bore 62. Conduit 60 extends in turn through the bottom walls of enclosure 22, susceptor 36 and crucible 24, as shown in FIG. 1. The inside diameter of conduit 60 is slightly greater than the outside diameter of the largest particles of silicon to be supplied by the system 18 of the present invention, as discussed below. Preferably, conduit 60 is made of fused silica. Conduit 60 is positioned in the center of crucible 24 and is sized so that its top end 64 extends up into the interior 30 of inner after-heater 26, slightly above the top surface of the melt supported in crucible 24 when the crucible is full. Thus, conduit 60 provides a passageway from the region below apparatus 20 up through the bottom wall of crucible 24 into the interior 30 of inner after-heater 26. Preferably, a convex conical deflector 66 is attached to the bottom surface of top plate 32 directly above the top end 64 of conduit 60 so that the pointed end 67 of the deflector is coaxially aligned with central bore 62.

In other respects, the crystal growth furnace illustrated in FIG. 1 is identical to the furnace described in the '528 patent.

Silicon feed system 18 includes a hollow container 70 for storing particles 72 of solid silicon. Particles 72 are spherical and preferably have an outside diameter of 1 millimeter, with a tolerance of ±½ millimeter. Thus, the mass and volume of each of the particles 72 is roughly equal.

Container 70 includes an aperture 74 positioned at the bottom of the container through which particles 72 are dispensed from the container and an open top end 76 through which particles 72 are supplied to the container. As described hereinafter, container 70 may optionally include a cover 78 (shown in phantom in FIG. 1) for sealing open end 76.

System 18 further includes particle dispenser 80 coupled with container 70 for causing silicon particles 72 stored in the container to exit the container via aperture 74. Preferably, particle dispenser 80 comprises a source of pressurized fluid, e.g., argon gas, for pressurizing the interior of container 70 so as to force particles 72 out of aperture 74. Where particle dispenser 80 constitutes a source of pressurized fluid, container 70 should include cover 78 or otherwise be designed so as to permit the interior of the container to be suitably pressurized. Alternatively, particle dispenser 80 may comprise a vibrator for causing container 70 to vibrate so that particles 72 migrate toward aperture 74 where, due to the combined effect of gravity and the weight of adjacent particles, the particles pass through aperture 74. As those of ordinary skill in the art will readily appreciate, particle dispenser 80 may comprise other means for causing particles 72 to exit container 70 via aperture 74.

System 18 also includes a hollow receiving chamber 82. The latter includes a top opening 84, a bottom opening 86, and a side opening 88. Receiving chamber 82 is attached at its top opening 84 to conduit 60 so that central bore 62 communicates with the interior of the receiving chamber. Preferably the bottom end of conduit 60 extends down into receiving chamber 82 as shown. Receiving chamber 82 is positioned relative to container 70 so that the side opening 88 of the receiving chamber is positioned a suitable distance below aperture 74 of the container, as discussed hereinafter. Preferably, the bottom portion of receiving chamber 82 tapers inwardly toward bottom opening 86 so as to funnel silicon particles 72 present in the chamber toward bottom opening 86. Receiving chamber 82 is preferably made of a non-metallic material which cannot be readily eroded or abraded by silicon particles 72, such as plastic.

System 18 comprises a hollow pipe 90 attached to container 70 at its aperture 74 and to receiving chamber 82 at its side opening 88, so that a continuous passageway is provided from the interior of container 70, through aperture 74, the interior of pipe 90, and side opening 88 into the interior of receiving chamber 82. Container 70 is positioned above receiving chamber 82 a distance selected so that pipe 90 slopes downwardly at a relatively steep angle, e.g. 45° with respect to a horizontal plane, from container 70 to receiving chamber 82. Pipe 90 is preferably made from a non-metallic material which is not easily eroded by particles 72.

System 18 also includes an inlet port 96 which leads to a tube 94 that is connected to the bottom opening 86 of receiving chamber 82, so as to communicate with the interior of the receiving chamber. Inlet port 96 is connected to a source of pressurized fluid (not shown), e.g. a source of argon gas under pressure. Tube 94 directs a stream of pressurized fluid up into the interior of receiving chamber 82 via its bottom opening 86. Depending upon the size of tube 94, it may be desirable to provide a restricted orifice 98 in the tube directly below bottom opening 86 in receiving chamber 82 to increase the velocity of the fluid into receiving chamber 82.

The volume flow rate of the gas introduced via port 96, the size of orifice 98, if provided, the vertical distance between bottom opening 86 of receiving chamber 82 and top end 64 of conduit 60, and the vertical spacing between top end 64 of conduit 60 and the pointed end 67 of deflector 66 are selected so as to ensure particles 72 present in receiving chamber 82, each of which have a substantially identical and known mass, as noted above, are entrained in the gas jet provided by tube 94 and are driven upward through conduit 60 with sufficient force to contact deflector 66 provided in the interior 30 of inner after-heater 26. Of course, these parameters will vary with changes in mass and diameter of the particles 72 and with changes in one or more of the parameters relative to the other parameters. In a working embodiment of system 18, argon gas was fed from a gas source having a pressure of about 20 pounds per square inch through inlet port 96 at a volume flow rate of 5 liters STP (i.e., a temperature of 25 degrees C. and an atmospheric pressure of 760 mm Hg) per minute, orifice 98 had an inside diameter of 0.031 inches, the vertical distance from top end 64 of conduit 60 to the bottom opening 86 of receiving chamber 82 was about 17 inches, and top end 64 was positioned about 1.73 inches below the pointed end 67 of deflector 66. Spherical silicon particles having an outside diameter of about 1 millimeter, plus or minus ⅛ millimeter, were used as the feed material.

To use the melt replenishment system 18 of the present invention, a quantity of spherical, solid silicon particles 72, preferably having an outside diameter of about 1 millimeter, plus or minus ⅛ millimeter, is placed into container 70 through its open top end 76. Then a stream of pressurized fluid, e.g. argon gas, is directed via inlet port 96 and tube 94 up through bottom opening 86 into receiving chamber 82. Particle dispenser 80 is then activated so that silicon particles 72 are dispensed from container 70 through its aperture 74. Where particle dispenser 80 comprises a source of pressurized fluid, cover 78 is attached to container 70 before the particle dispenser is activated. Particles 72 dispensed through aperture 74 enter pipe 90 and slide downwardly, under the pull of gravity, through the pipe and side opening 88 into receiving chamber 82.

Upon entering receiving chamber 82, particles 72 slide down along the inwardly-tapering walls of the bottom portion of receiving chamber 82 toward bottom opening 76. As particles 72 approach bottom opening 86, they are entrained in the jet of pressurized fluid introduced by tube 94, whereby that gas stream carries the particles up into and through the central bore 62 of conduit 60 and out through the top end 64 of the conduit. Then, the particles 72 continue to travel upwardly within the inner after-heater 26 until they contact and bounce off deflector 66, if provided, and fall into the melt. Deflector 66 evenly distributes particles 72 so they enter the melt over substantially the entire surface thereof, thereby minimizing the formation of locally cool zones which can give rise to currents and thermal excursions in the melt which can catastrophically terminate the crystal growth process. Where deflector 46 is not provided, particles 72 merely bounce off the bottom surface of plate 32 and fall into the melt. In certain cases, acceptable results can be obtained without the use of deflector 66.

Although it is intended that melt replenishment system 18 will be operated using spherical silicon beads, the system can also be operated using irregularly-shaped silicon particles having a specific dimensional characteristic. Specifically, silicon particles having a parameter L/D ranging from about 1 to 1.2 can generally be satisfactorily employed in system 18. The parameter L/D refers to the length of the silicon particle as measured along its long axis divided by the diameter of the particle as measured along an axis extending perpendicular to the long axis. Clearly, for spherical particles the parameter L/D is equal to 1 whereas for long, thin particles the parameter L/D could be equal to 5 or more.

An important advantage of the melt replenishment system of the present invention is that relatively long crystalline bodies can be grown using a crystal growing apparatus coupled with the present system since the length of the growing crystalline body is not limited by the quantity of molten silicon contained in the crucible of the crystal-growing apparatus. Relatedly, the present melt replenishment system additionally facilitates the growth of relatively long crystalline bodies by adding solid silicon particles to the melt in a fashion minimizing formation of thermal excursions in the melt. As is known, the possibility that a thermal excursion of the magnitude causing the catastrophic termination of the crystal growth process will occur increases with the length of the growing crystalline body. For reasons of cost and manufacturing efficiency, it is desirable to grow relatively long crystalline bodies.

Since certain changes may be made in the above apparatus and method without departing from the scope of the invention herein involved, it is intended that all matter contained in the above description or shown in the accompanying drawing shall be interpreted in an illustrative and not in a limiting sense.

What is claimed is:

1. A system for feeding solid silicon particles into an apparatus for growing hollow, tubular crystalline bodies, the apparatus including a crucible for containing a melt of silicon, said crucible having a bottom wall, the system comprising:

storage means for storing solid silicon particles;

conduit means coupled to said storage means and said crucible for providing a pathway from said storage means to said crucible along which solid silicon particles stored in said storage means can be transported from said storage means to said crucible; and feed means for dispensing solid silicon particles stored in said storage means into said conduit means and for providing a stream of pressurized fluid to said conduit means so as to cause solid silicon particles in said conduit means to be transported by said pressurized fluid into said crucible.

2. A system according to claim 1 wherein said conduit means comprises:

a receiving chamber for supporting solid silicon particles;

a first conduit coupling said storage means with said receiving chamber; and a second conduit coupled to said receiving chamber and couplable with said crucible.

3. A system according to claim 2 wherein said receiving chamber comprises a radially-inwardly tapering bottom portion and an aperture in said bottom portion coupling said receiving chamber with said feed means.

4. A system according to claim 2 wherein said storage means is positioned above said receiving chamber and said first conduit is inclined downwardly from said storage means toward said receiving chamber.

5. A system according to claim 2 wherein said second conduit has a top end and said second conduit is sized so that said second conduit can be attached to said crucible so as to extend up through the interior of said crucible so that said top end of said second conduit is positioned above the surface of molten silicon contained in said crucible.

6. A system according to claim 1 wherein said feed means comprises means for pressurizing said storage means so as to urge solid silicon particles stored in said storage means into said conduit means.

7. A system according to claim 1 wherein said feed means comprises vibration means coupled to said storage means for causing said storage means to vibrate so as to cause solid silicon particles stored in said storage means to move into said conduit means.

8. A system according to claim 1 wherein said conduit means is designed and is coupled with said crucible so that said pathway terminates at a selected location above the surface of the melt contained in said crucible.

9. A system according to claim 8 wherein said feed means causes silicon particles in said conduit means to be transported to positions above said selected location.

10. A system according to claim 9 wherein said system further comprises deflector means for deflecting said silicon particles transported to said positions above said selected location so as to cause said silicon particles to enter said melt so as to minimize thermal excursions of said melt.

11. A system according to claim 1 wherein said stream of pressurized fluid is a stream of inert gas.

12. A system according to claim 1 wherein said storage means comprises a canister having a bottom wall and an interior chamber for storing said solid silicon particles, said canister further including an aperture adjacent said bottom wall coupling the conduit means with said interior chamber.

13. A system for feeding solid silicon particles into an apparatus for growing hollow, tubular crystalline bodies, the apparatus including a crucible for containing a melt of silicon, said crucible having a bottom wall, the system comprising:
   storage means for storing solid silicon particles, said storage means comprising a canister having a bottom wall and an interior chamber for storing said solid silicon particles, said canister further including an aperture adjacent said bottom wall through which silicon particles stored in said canister can be dispensed from said canister;
   conduit means for providing a pathway from said storage means to said crucible along which solid silicon particles stored in said storage means can be transported from said storage means to said crucible, said conduit means comprising (a) a receiving chamber for supporting solid silicon particles, (b) a first conduit coupling said storage means with said receiving chamber, and (c) a second conduit coupled to said receiving chamber and also coupled to said crucible, said receiving chamber being positioned below said canister so that said first conduit slopes downwardly from said container toward said receiving chamber, said second conduit comprising a top end that is located at a selected location above the surface of the melt contained in said crucible;
   dispensing means coupled with said interior chamber of said container for urging silicon particles stored in said container to pass through said aperture and into said first conduit, said dispensing means comprising a source of pressurized gas;
   feed means for providing a stream of pressurized gas in said receiving chamber which entrains solid silicon particles in said receiving chamber and carries said entrained silicon particles through and out of said second conduit; and
   deflector means positioned above said top end of said second conduit for deflecting silicon particles carried by said stream of pressurized gas past said top end of said second conduit so as to cause said silicon particles to be substantially evenly distributed over the surface of the melt contained in the crucible.

14. A system for feeding solid silicon into an apparatus for growing a hollow, tubular crystalline body, the apparatus including a crucible having an interior chamber for containing a melt of silicon, the system comprising:
   a canister having an interior chamber for storing solid silicon particles and an aperture through which silicon particles stored in said canister may be dispensed from said canister;
   a conduit having a hollow interior coupled to said canister so that said interior chamber of said canister is in communication with said hollow interior of said conduit, said conduit being couplable to said crucible so that the interior chamber of said crucible is in communication with said hollow interior of said conduit, the latter being configured so as to extend into said interior chamber of said crucible when said conduit is attached to said crucible;
   a first source of pressurized gas coupled with said canister so as to pressurize said interior chamber of said canister;
   a second source of pressurized gas coupled with said conduit so as to generate a stream of pressurized gas in said conduit.

15. A system for growing tubular, hollow crystalline bodies, the system comprising:
   an apparatus for growing tubular, hollow crystalline bodies, said apparatus including a crucible having (a) an interior chamber for containing a melt of silicon, (b) a top end, and (c) a bottom end, said apparatus further including a hollow pipe extending from below said bottom end, through said interior chamber and terminating above said top end of said crucible;
   storage means for storing solid silicon particles;
   conduit means coupled to said hollow pipe and to said storage means for providing a pathway from said storage means to said hollow pipe along which solid silicon particles stored in said storage means can be transported from said storage means to said hollow pipe; and
   feed means for urging solid silicon particles stored in said storage means into said conduit means and for providing a stream of pressurized fluid in said conduit means so as to cause solid silicon particles in said conduit means to be transported by said stream of pressurized fluid into and through said hollow pipe.

16. A method of replenishing the silicon melt in the crucible of an apparatus for growing hollow crystalline bodies, the method comprising the steps of:
   (1) providing an apparatus for growing hollow, tubular crystalline bodies, said apparatus comprising a crucible having an interior chamber containing a melt of silicon and a hollow pipe having a bottom end positioned below said crucible, an intermediate portion extending through said interior chamber of said crucible and a top end positioned above the top surface of said melt of silicon contained in said crucible;

(2) providing a system for replenishing the melt in said crucible with solid, spherical silicon beads, the system comprising:

(a) storage means for storing solid spherical silicon beads;

(b) conduit means coupled to said storage means and couplable to said hollow pipe for providing a pathway from said storage means to said hollow pipe along which solid, spherical silicon particles stored in said storage means can be transported from said storage means to said hollow pipe; and (c) feed means for dispensing solid silicon particles stored in said storage means into said conduit means and for providing a stream of pressurized gas in said conduit means so as to entrain solid silicon particles in said conduit means and carry said entrained particles into and through said hollow pipe when said conduit means is coupled with said hollow pipe;

(3) coupling one end of said conduit means with said bottom end of said hollow pipe;

(4) adding solid, spherical silicon beads of predetermined diameter to said storage means;

(5) providing a stream of pressurized gas of selected pressure in said conduit means extending toward said one end of said conduit means;

(6) dispensing said beads into said conduit means;

(7) entraining said beads in said stream of pressurized gas and carrying said beads entrained in said stream into and through said hollow pipe and ejecting said beads from said top end of said pipe so as to permit said beads to fall into said melt contained in said crucible.

17. A method according to claim 16 wherein said step (6) includes pressurizing said storage means so as to force said silicon beads contained in said storage means into said conduit means.

18. A method according to claim 16 wherein said step (7) includes deflecting said beads ejected from said top end of said pipe so as to cause said beads to enter said melt in a manner minimizing the formation of thermal excursions in said melt.

19. A method according to claim 16 wherein said predetermined diameter of said beads added in said step (4) to said storage means is about 1 millimeter ½ millimeter.

20. A method according to claim 16 further including the step, following said step (6), of transporting said beads dispensed from said storage means through said conduit means into contact with said stream of pressurized gas.

* * * * *

UNITED STATES PATENT AND TRADEMARK OFFICE
CERTIFICATE OF CORRECTION

PATENT NO. : 4,968,380

DATED : November 6, 1990

INVENTOR(S) : Gary M. Freedman et al

It is certified that error appears in the above-identified patent and that said Letters Patent is hereby corrected as shown below:

Claim 19, column 10, line 22, the term "+/-" should be inserted after "millimeter" and before "1/2".

Signed and Sealed this

Seventeenth Day of March, 1992

Attest:

HARRY F. MANBECK, JR.

*Attesting Officer*      *Commissioner of Patents and Trademarks*